June 23, 1959 W. L. HURFORD 2,892,026
PLURAL CHANNEL CIRCUIT MAINTENANCE
Filed May 1, 1956 2 Sheets-Sheet 1
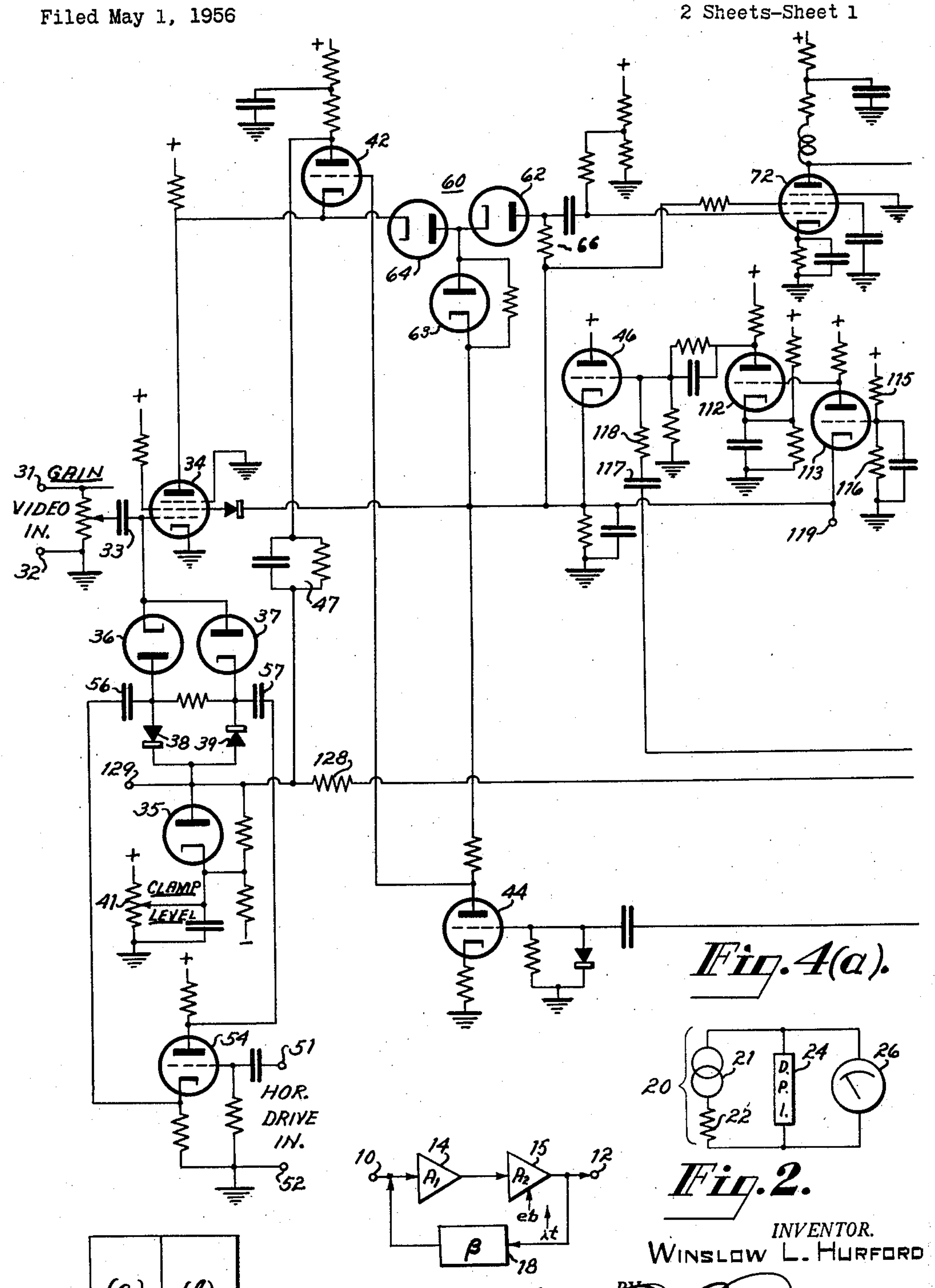
FIG. 4(a). FIG. 2. FIG. 1.
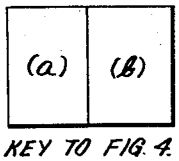
KEY TO FIG. 4
INVENTOR.
WINSLOW L. HURFORD
BY
[signature]
ATTORNEY

PLURAL CHANNEL CIRCUIT MAINTENANCE

Filed May 1, 1956 2 Sheets-Sheet 2

INVENTOR.
WINSLOW L. HURFORD
BY [signature]
ATTORNEY

United States Patent Office 2,892,026
Patented June 23, 1959

2,892,026

PLURAL CHANNEL CIRCUIT MAINTENANCE

Winslow Leroy Hurford, Collingswood, N.J., assignor to Radio Corporation of America, a corporation of Delaware Application May 1, 1956, Serial No. 581,970
6 Claims. (Cl. 178—7.1)

The invention relates to electric wave signal translating circuitry, and it particularly pertains to the determination of reliability and effectiveness of feedback amplifiers, redundant circuits and similar plural channel handling circuits.

Feedback amplifiers in general are well known in the art. Such amplifiers have a forward feeding signal amplifying channel incorporating vacuum tubes, transistors or other controlled electron flow path amplifying devices and a feedback signal handling channel, normally consisting solely of passive circuit elements but which may contain amplifying devices. Redundant circuits comprise a plurality of signal translating circuits connected in parallel and arranged so that any one circuit will perform the necessary function should the other circuits fail. Preferably redundant circuit amplifiers comprise a plurality of feedback amplifiers in order to provide input and output impedance characteristics of such value that the signal level will vary less with the availability of each amplifier than would be the case if forward feeding circuits only were employed. Other plural channel signal handling circuitry employing feedback signal translating channels are found in servo systems, in television signal clamping circuits, and in others of the electronic arts.

While feedback circuitry of fairly high loop gain is highly advantageous in providing circuit stability in spite of variations due to changes between different vacuum tubes of a given type, ageing of vacuum tubes, and changes in energizing voltage levels, a severe maintenance problem arises in that the very function which stabilizes the overall performance of such circuits tends to obscure the gradual deterioration of the amplifying circuit characteristics until sudden failure is encountered. To date, the only maintenance technique suggested for checking the gain, or determining the reliability, of a plural channel amplifying circuit is for the technician to physically disrupt the circuit and measure the individual characteristics of the various components. Needless to say this is costly both as to the time and money involved. Furthermore there is always the possibility that the circuit may not be properly restored to the operating condition, whereby the reliability remains in doubt even after checking.

An object of the invention is to formulate a routine method for checking the condition of plural channel signal handling circuitry without physically disrupting the circuitry.

Another object is to provide simple auxiliary apparatus for enabling rapid routine gain, reliability, and effectiveness checks of plural signal translating apparatus.

One solution to the problem is based on the fact that the driving point or input impedance of a signal handling circuit having feedforward and feedback channels operating on a given signal is modified by the quantity one plus the loop gain. If the loop gain is relatively high the driving point impedance will vary substantially in direct proportion to the variations in gain of the amplifying circuits. According to the invention a constant current test signal is injected into one channel, preferably the feedback channel, to produce a voltage across the effective input or driving point impedance component of the circuit, which voltage will be proportional to the impedance. The impedance is in turn regulated by the gain of the amplifying circuitry. Voltage across the one channel produced in response to the injected test signal is then measured to determine the effectiveness of the circuit as a whole. Initially the check voltage is measured to determine the normal operating value, after which the check readings taken in service are compared with the initial reading to determine the relative effectiveness. The check voltage need not be measured at the same point at which the test signal is injected but may be measured at another point in the circuit if more convenient, since the ratios of the voltages under initial and service conditions should be the same for any point in the circuits. In this manner simplified measuring equipment may be employed.

Further according to the invention, routine checks of great sensitivity may be made with simple circuitry. An alternating current test signal of substantially constant intensity may be obtained by connecting a relatively low impedance transformer winding, such as frequently used for electron discharge tube cathode heating, and a relatively high resistance element in series. This effective test signal generating source is connected to the input circuit of one channel to produce substantially constant current flow through the effective driving point impedance component of the signal translating circuit arrangement. The voltage produced by the translating arrangement in response to the injected test signal may be measured by connecting a sensitive potential measuring device, such as a vacuum tube voltmeter or a cathode ray oscilloscope, across the one channel.

In practice the test signal injecting circuit may be selectively connected to a number of stages of complex electron wave translating circuitry by means of a simple multipole selector switch arrangement and arranged to provide the same relative reading for indicating the need for repair or replacement of the apparatus under consideration.

In order that all the advantages of the invention may be readily obtained in practice, several embodiments of the invention are described hereinafter with reference to the accompanying drawing in which:

Fig. 1 is a functional diagram of a feedback amplifying circuit in which the invention may be incorporated;

Fig. 2 is a simplified schematic diagram of a feedback amplifier incorporating the invention;

Figures 3, 4B, 5:
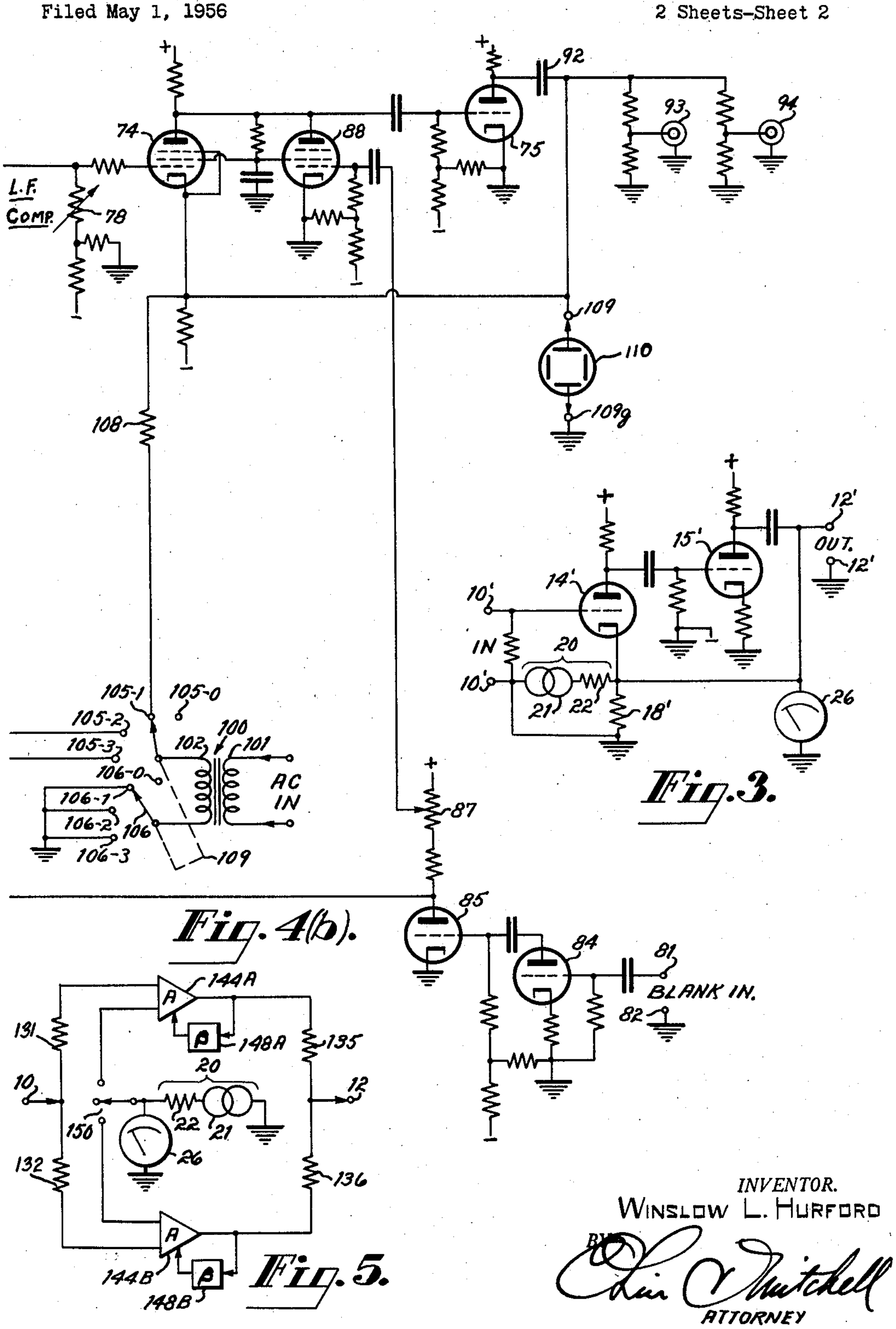
Fig. 3 is an equivalent diagram useful in explaining the invention.

Figs. 4*a* and 4*b* are schematic diagrams of complex wave translating circuitry incorporating a plurality of embodiments of the invention; and Fig. 5 is a functional diagram of redundant amplifying circuitry to which the invention may be applied.

Referring to Fig. 1 there is shown a functional diagram of a fundamental feedback amplifier. Electric wave signals applied at input terminals 10 and required to be repeated with amplification at output terminals 12 are amplified by a forward feeding channel comprising amplifying circuits 14 and 15 connected between the input terminals 10 and the output terminals 12. The operation of the feedforward amplifying channel is stabilized by means of a feedback channel comprising a network 18 connected between the output terminals 12 and the input terminals 10. The feedforward channel necessarily contains amplifying devices, whereas the feedback channel most frequently comprises passive components only, although in special cases active amplifying devices may be interposed in the feedback channel if desired.

The overall gain of the feedback circuit arrangement shown in Fig. 1 may be expressed as:

$$G=\frac{l_{out}}{l_{in}}=\frac{A_1A_2}{1+A_1A_2\beta}=\frac{\mu}{1+\mu\beta} \quad (1)$$

$$\cong\frac{1}{\beta} \text{ where } \mu\beta\gg 1 \quad (2)$$

where

A is the gain of an amplifier circuit,
$\mu$ is the total gain of the amplifier circuits, and
$\beta$ is the feedback factor.

It can be seen from these equations that with feedback amplifiers there may be large variations in the gain of the amplifying devices without an appreciable change in the overall gain of the feedback amplifier. Hence it is very difficult to assess the deterioration of the feedforward channel without opening the feedback loop.

According to the invention a test current is applied at some suitably chosen point in the circuit and the voltage produced in response to the test current is measured. This voltage may be expressed as:

$$l_t=kz \quad (3)$$

where $k$ is the proportionality factor, and
$z$ is the driving point impedance.

In other words the voltage produced is proportional to the active driving point impedance. The active driving point impedance is related to the passive driving point impedance as given below:

$$\frac{z}{z_0}=\frac{1}{1+\mu\beta} \quad (4)$$

$$\cong\frac{1}{\mu\beta} \text{ where } \mu\beta\gg 1 \quad (5)$$

It should be noted that while the overall gain shows almost no variation with changes in gain of the individual amplifier circuits, the active driving point impedance varies inversely with the gain of the circuits and therefore provides a direct indication of deterioration of the tubes and critical components in the feedforward channel. All that is required to definitely evaluate the effectiveness of a plural channel or feedback amplifier is to inject a substantially constant current into the circuit, measure the resultant voltage produced in response to that current under conditions of normal operation to calibrate the checking apparatus, and thereafter measure the voltage produced by again injecting the test current under ensuing conditions. If the effectiveness of the amplifier has dropped off to any serious extent a considerable increase in observed voltage will be noted. If, for example, one or more of the amplifying devices is completely inoperative, the maximum voltage will be observed.

This voltage change may be more readily understood with reference to Fig. 2. The constant current source 20 is represented by a zero impedance alternating current generator 21 connected in series with a relatively high resistance element 22 across an impedance element 24 representing the driving point impedance of the circuit under consideration. A potential measuring device 26 is connected across the impedance element 24 to measure the potential developed thereacross in response to the constant current derived from the source 20. It follows from basic considerations that the voltage observed on the measuring device 26 will be large for large impedance values and low for low impedance values and so on. Thus if the feedback circuit alone is operative the voltage measured will be a maximum and proportional to the driving point impedance. If the forward feed channel is fully effective the voltage observed on the measuring device will still be proportional to the driving point impedance but reduced by a factor approaching the total gain of the feedforward channel. Upon establishing an appropriate limit voltage at which the equipment is considered reliable, the technician may inject a test current and route the apparatus for repair at any time the observed voltage exceeds this predetermined limit.

Referring to Fig. 3 a simplified feedback amplifier circuit is shown to illustrate a basic mode of application of the invention. The feedforward channel comprises a pair of controlled electron flow path devices, illustrated by conventional vacuum tube symbols 14', 15' connected in cascade between input terminals 10' and output terminals 12'. The feedback channel comprises a connection between the output terminals 12 and the cathode of the input controlled electron flow path device 14' across a resistance element 18'. This resistance element is in shunt across the feedback channel and also serves in this example as the selfbias source for the input device 14'. A substantially constant current is introduced in the feedback channel by means of the test source 20 comprising a generator 21 and a relatively high resistance element 22 connected across the shunt resistance element 18'. The test current flowing in the resistance element 18' produces a voltage across the input circuit of the input device 14' in turn producing a voltage across the output terminals 12' which may be measured by means of the sensitive alternating potential measuring device 26. The latter may be a vacuum tube voltmeter, but preferably is a cathode ray oscilloscope since the latter apparatus permits a visual inspection of waveform as well as an indication of amplitude.

The invention is applicable to circuitry having feedback loops other than amplifiers. An example of such application is found in the schematic diagram of Fig. 4 illustrating a complex wave translating apparatus for processing television picture signals in a television broadcast studio. A picture signal, obtained for example from a television camera, is applied at input terminals 31, 32, for application by way of a coupling capacitor 33 to the input circuit of a video amplifying tube 34. Because the direct component of the video signal is lost in the coupling capacitor 33, the signal must be clamped to restore the direct component. The signal is clamped by means of four diode elements 36–39 to a level which is a function of the past history of the circuit. This video signal appears at the anode of the amplifying tube 34 with a direct component determined by the before mentioned clamp level. The voltage level during the blanking interval is sampled by a sampling tube 42. Blanking pulses applied to a sampler driving tube 44 are effective to cause conduction in the sampling tube 42 only during the blanking interval. During the blanking interval the driving tube 44 is blocked and the grid of the sampling tube 42 returns to a regulated intermediate reference potential at the cathode of a regulator tube 46. The current drawn by the sampling tube 42 during the blanking interval is determined by the voltage level of the video blanking interval as it appears at the anode of the video amplifying tube 34 which is connected to the cathode of the sampling tube 42. The current drawn by the sampling tube 42 produces a voltage drop at the anode which is applied to the reference terminal of the clamping circuit through a filter network 47. Horizontal drive pulses, which are synchronized with the blanking pulses, are applied at input terminals 51, 52 of a clamp driving tube 54 which applies paraphase pulse potentials to the clamping circuit by way of coupling capacitors 56, 57 to complete the feed-back loop. If for some reason the voltage level during the blanking interval is too high at the anode of the amplifying tube 34, the sampling tube 42 will draw less current and the anode voltage will be higher. The clamp reference thus becomes more positive causing the amplifying tube 34 to draw more current thus lowering the anode voltage. From this discussion it may be seen that the feedback loop functions to reduce variations in the voltage level during the blanking interval.

Now this video signal with stabilized blanking level is applied to a clipping circuit 60 to establish the black level of the picture signal to be transmitted. In prior art arrangements the signal is applied to a series diode element 62, the anode electrode which is maintained at a positive potential by means of a resistor 66 connected to the regulated intermediate reference potential point at the cathode of the regulator tube 46. Another diode element 63 is connected between this reference voltage point and the cathode of the black level clipping diode 62 to suppress transient voltages which appear when the series diode 62 cuts off. This prevents high voltages from being applied to the block series diode 62 which would otherwise cause capacitive currents to flow in the cathode-plate capacitance of the blocked diode 62 and the load resistor 66 to produce voltage transients, or "spikes," in the output waveform. In the arrangement shown, however, a further diode element 64 is interposed between the anode of the video frequency (V.-F.) amplifying tube 34 and the series diode element 62 to prevent the conduction of the transient suppressing diode elements 63 from loading the signal voltage circuit at the cathode of the sampling tube 42, which conduction would limit the voltage change at the cathode of the campling tube 42 during the sampling interval. Such conduction of the transient suppressing diode element 63 would cause a marked loss in loop gain which would effectively spoil the stabilizing action of the feedback clamp. The load reducing diode element 64 blocks off during the blanking interval to prevent the transient suppressing diode 63 from loading the sampling tube circuit. In this manner effective transient suppression is obtained while at the same time high loop gain in the clamping circuit is preserved.

The stabilized picture and blanking signal is applied to an amplifying stage comprising a pentode amplifying tube 72 and, referring specifically to Fig. 4*b*, a feedback amplifying stage comprising a pentode input tube 74 and a triode output tube 75. Low frequency compensation is introduced in the input circuit of the input amplifying tube 74 by varying the input circuit resistance. Blanking pulses available at input terminals 81, 82 are amplified by a pair of amplifier tubes 84, 85 connected in cascade and the amplified pulses are applied to the grid of a mixing tube 88, the anode of which is connected in parallel with the anode of the input amplifying tube 74. The set up level of the blanking pulses in the signal is determined by adjustment of the set up level potentiometer 87 in the anode circuit of the blanking signal amplifying tube 85. The combined picture and blanking signal with properly established set up or blanking level appears at the anode of the output amplifying tube 75 and is applied by means of a coupling capacitor 92 to output terminals 93 and 94 for application to suitable utilization circuitry. The output potential is also applied by way of a lead connected to the output electrode of the coupling capacitor 92 to the cathode electrode of the input amplifying tube 74 to provide negative feedback.

The effectiveness of the circuit is readily determined according to the invention with simple auxiliary circuit components. A low alternating voltage is obtained from a transformer 100 having a primary winding 101, which may be connected to the local power line, and a secondary winding 102 which may also be used to supply cathode heating potential for one or more of the electron discharge devices in the processing amplifier. A switch 104, having two arms 105 and 106, is normally set on contacts 105–0 and 106–0 so that the transformer winding is ineffective in so far as the circuit arrangement of the invention is concerned. In order to measure the gain of the amplifying tubes 74 and 75 the switch arms 105 and 106 are rotated to contacts 105–1 and 106–1 respectively to connect the winding between a series resistor 108 and a point of reference potential, shown as ground. It should be understood that in those circuit arrangements wherein one side of the heater voltage is normally maintained at ground potential, one switch art 106 will be unnecessary. The other terminal of the series resistor 108 is connected to the cathode of the input amplifying tube 74 so that an alternating current of substantially constant intensity is injected in the feedback amplifier circuit. The voltage produced across the feedback circuit in response to the injected test current is measured across tip-jacks 109 and 109*g* by a sensitive potential measuring device shown as a cathode ray oscilloscope 110. Preferably the test is made without any picture signal applied to the feedback amplifier so that the change in voltage indicating the worth of the feedback amplifier circuit is more clearly determined, although with certain types of signals there will be no difficulty in making the check while the amplifier is in actual operation. The feedback amplifier exemplified by the tubes 74 and 75 lends itself to measuring the induced voltage at the test current injection points. This is not a limitation of the invention, however, because the voltage at any point in the feedback circuit will be proportional to the injected current and the observed voltages for initial and subsequent operation will be of the same ratio at any given point of the circuit.

The circuit for regulating the intermediate reference potential, referring back specifically to Fig. 4*a*, comprises a feedback amplifier including the regulator tube 46 and a pair of triode tubes 112, 113. A potential proportional to the energizing potential is obtained by means of a potentiometer comprising resistors 115 and 116 connected to the grid of a comparing tube 113. The reference voltage at the cathode of the regulator tube 46 is applied to the cathode of the comparing tube 113 so that variations in the regulated voltage are amplified by the amplifier tube 112 and applied to the grid of the regulator tube 46 in such manner as to substantially cancel the variations. This type of servo loop is exceedingly difficult to check without disturbing the connections. However according to the invention a constant current test signal is applied through the switching contacts 106–2 and 105–2 through a series capacitor 117 and a series resistor 118 between the grid of the regulator tube 46 and a point of reference potential, or ground. The output potential induced in the voltage regulating feedback circuit may be measured between the cathode of the regulator tube 46 at a tip-jack 119 and the reference potential point, which is ground in this case, at another tip-jack (not shown) or by a connection to the chassis. Since the feedback circuit delivers substantially direct current at the tip-jack 119, it is immaterial in testing whether the circuit is in operation or not provided no direct current connection is made between the measuring instrument and the tip-jack 119. The conventional test oscilloscope is not arranged to indicate the direct component of applied waves so that a better check can be made with the regulator stage under full load conditions.

A more complex type of feedback circuit which may be checked readily according to the invention is the feedback clamping circuit previously described. To check the circuit shown, the selector switch 104 is rotated to contacts 105–3 and 106–3 to apply a signal through a very high resistance series resistor 128 to the clamping circuit at the anode electrode of the diode element 35. The 60 c.p.s. current applied through the relatively high resistance of the resistor 128 at the reference point of the diode clamp constitutes an essentially constant current source so that the alternating potential produced at the clamp reference point will be a function of the apparent driving point impedance. This driving point impedance is less than it would be if the video frequency amplifying tube 34 were dead because of the action of the negative feedback loop previously described. This impedance is reduced by a factor equal to one plus the loop gain or $1+\mu\beta$. If the impressed current tends to raise the clamping reference potential, the V.-F. amplifying tube 34 draws more current, lowering the anode potential, causing the cathode of the sampling tube 42 to be lower in potential. Since the grid of the sampling tube 42 relaxes to a fixed intermediate reference potential, the tube draws more current and the anode potential is lowered. This lower anode potential is applied back to the clamp reference through the network 47 to oppose the impressed variation. The feedback action thus lowers the voltage resulting from the injected test current. The magnitude of this change may be determined by connecting a potential measuring device between the reference potential, or ground, and a tip-jack 129 connected to the anode of the clamping diode 35. This change is directly proportional to the gain of the V.-F. amplifying tube 34. Observation of the potential at the tip-jack 129 provides a direct indication of the performance at the V.-F. amplifying tube 34 and may be used as a warning of imminent failure known long before any reduction in performance of the feedback circuit is noticeable.

It is suggested that where a built-in indicating device is desired a rectifying circuit may be interposed at the test voltage measuring point and direct current leads be used to connect a direct potential type of vacuum tube voltmeter to the rectifier through a switching arrangement. In missile or other expendable installations a plug-in test arrangement may be used so that only the connection jacks remain with the apparatus during actual operation, both test current and measuring apparatus being connected by a single plug for each stage tested.

From the foregoing discussion those skilled in the art should readily determine applications of the invention to other types of feedback and plural channel circuitry. However, a brief discussion of the application of the invention to redundant circuits may be helpful. Redundant circuits are primarily, if not entirely, used to increase the reliability of electronic equipment. While basically two feedforward amplifying channels may be connected in parallel as a redundant circuit, it is a basic, principle in such circuitry that failure in either channel must not affect the signal level by any significant amount. It is also a basic principle of reliability that no sensing or switching be done but that the channels must be permanently connected. This means that there must be some isolation between the parallel input circuits and the input wave must be obtained from a substantially constant voltage source. Also the output circuit of the redundant circuit must act like a substantially constant voltage source for the utilization circuitry. While this is difficult to achieve solely with feedforward channels, it is easily achieved by the use of a feedback pair for each channel. Such an arrangement is illustrated by the functional diagram in Fig. 5 in which small isolation elements 131, 132 are interposed in the leads to the input terminals 10 and other small isolation elements 135, 136 are interposed in the leads to the output terminals 12. Each feedforward channel comprises a feedback pair each including a feedforward channel 144A or 144B and a feedback channel 148A or 148B. The constant current test signal is obtained from the generator 21 and the very high series resistance element 22 as previously described and applied selectively to the point of each feedback pair where the driving point impedance will be modified by the factor $1+\mu\beta$. The voltage inducted by the substantially constant current test signal may be measured at the output terminal of the resistance element 22 by the potential measuring device 26. In most applications the simple arrangement shown in Fig. 5 may be employed wherein a single-pole multi-throw switch 150 may be used to select either channel of a single redundant circuit or either channel of a plurality of redundant circuits of a number of stages of such circuitry.

While those skilled in the art will determine the values of components to be used in the practice of the invention, the values of pertinent components listed below, which were used in a television signal processing amplifier with entirely satisfactory results are suggested as a guide to the practice of the invention.

| Ref. No. | Component | Type or Value |
|---|---|---|
| 33 | Coupling capacitor | 0.01 mf. |
| 34 | V.-F. amplifying tube | p/s 6AW8 |
| 35–37 | Clamping diode elements | d/s 6BC7 |
| 38–39 | do | 1N34A |
| 41 | Level setting control | 130–175 Ko. |
| 42 | Sampling tube | t/s 6BQ7A |
| 46 | Voltage regulating tube | 6BX7 |
| 54 | Clamping drive tube | t/s 6AW8 |
| 56–57 | Coupling capacitors | 0.47 mf. |
| 62–64 | Clipping diode elements | d/s 6BC7 |
| 63 | Transient suppressor load | 270 O. |
| 72 | V.-F. amplifying tube | p/s 6AW8 |
| 75 | do | 6BX7 |
| 78 | Low freq. comp. control | 100–350 Ko. |
| 84–85 | Blanking signal amplifier | t/s 12AT7 |
| 87 | Setup level control | 560–1060 O. |
| 88 | Setup mixer tube | p/s 6U8 |
| 92 | Coupling capacitor | 250 mf. |
| 102 | Test signal winding | 6.3 V., 60 c.p.s. |
| 103 | Series resistor | 200 Ko. |
| 112–113 | V.R. amplifier tubes | t/s 6AW8 |
| 115 | Divider resistor | 62 Ko. |
| 116 | do | 75 Ko. |
| 117 | Blocking capacitor | 0.01 mf. |
| 118 | Series resistor | 470 Ko. |
| 128 | do | 390 Ko. |

The power supply delivered 280 volts positive with 140 volts regulated at the cathode of regulator tube 46 and 105 volts negative with respect to ground in each instance.

The invention claimed is:

1. An electric wave signal amplifying circuit arrangement including, input terminals, a signal amplifying channel having an input circuit connected to said input terminals, and having an output circuit, output terminals connected to the output circuit of said one channel, a feedback channel having input and output circuits respectively connected to said output and input terminals and an effective driving point impedance, means including a low impedance alternating current source and a relatively high resistance element interposed in series in said feedback channel to introduce therein and through said driving point impedance an alternating current test signal of substantially constant intensity, and means including a sensitive potential measuring device to measure the voltage produced in said feedback channel across said driving point impedance in response to said test signal.

2. An electric wave signal amplifying circuit arrangement including, input terminals, a signal amplifying channel having an input circuit connected to said input terminals, and having an output circuit, output terminals connected to the output circuit of said one channel and an effective driving point impedance, a feedback channel having input and output circuits respectively connected to said output and input terminals, means including a transformer winding and a relatively high resistance element interposed in series in said feedback channel to introduce therein an alternating current test signal of substantially constant intensity which flows through said driving point impedance, and means including a cathode ray beam deflecting device to measure the voltage produced in said feedback channel across said driving point impedance in response to said test signal.

3. Electric wave signal translating apparatus including, a plurality of stages of signal translating circuitry, a number of said stages comprising a plurality of signal handling channels connected to form a closed circuit, means including a transformer winding, a multi-throw switch and a number of resistance elements of resistance relatively high with respect to that of said generating transformer winding for generating substantially constant current test signals and for selectively introducing said test signals in one of said plurality of signal handling channels of each stage of said number of stages, and means including tip jacks for connecting a potential measuring device across the selected channel for measuring the magnitude of voltage produced in response to said test signal to determined the effectiveness of all channels of each stage.

4. Electric wave signal translating apparatus as defined in claim 3 and wherein said generating means includes a transformer winding for supplying cathode heating power to an electron discharge device in said translating apparatus.

5. Electric wave signal translating apparatus as defined in claim 4 and wherein said multi-throw switch comprises two poles one of which is arranged to return said transformer winding to a point of fixed reference potential of said signal translating apparatus.

6. A clipping and clamping circuit arrangement for processing a television picture signal and having means for checking the effectiveness of the circuit arrangement, including a video frequency amplifying tube having grid, cathode and anode electrodes, means including a capacitor for applying a video frequency wave between said grid and said cathode, a pair of diode elements having unlike electrodes connected to said grid and the other electrodes connected by way of direct current carrying means of substantial impedance to said cathode, a load element, a clipping circuit comprising two diode elements connected in series between said anode and said load element and another diode element connected to the connection between said series connected diode elements and a terminal of said load element remote from said series connected diode elements, means establishing said terminal of said load element at a point of reference potential intermediate the potential of said anode and that of said cathode, a sampling tube having a cathode electrode connected to said anode, a control electrode and an anode electrode, means normally returning said control electrode to said reference potential, means connecting said anode electrode to the junction between said other electrodes of said clamping diode elements and said means of substantial impedance, means coupled to said control electrode and means coupled to the other electrodes of said clamping diode elements for effecting conduction in the respective elements to clamp said video frequency wave to a predeterminedt level, a source of alternating potential of given impedance, means including a resistive element of resistance relatively high with respect to said given impedance for selective connection to said clamping circuit across said means of substantial impedance to introduce a substantially constant current test signal, and means for connecting an alternating potential measuring device across said means of substantial impedance to determine the effectiveness of said clipping and clamping circuit arrangement.

References Cited in the file of this patent

UNITED STATES PATENTS

| | | |
|---|---|---|
| 2,595,646 | Doba | May 6, 1952 |
| 2,733,433 | Morrison | Jan. 31, 1956 |